(12) United States Patent
Jeong et al.

(10) Patent No.: US 7,823,051 B2
(45) Date of Patent: Oct. 26, 2010

(54) DIGITAL BROADCASTING TRANSMISSION SYSTEM AND METHOD THEREOF

(75) Inventors: Hae-joo Jeong, Seoul (KR); Jung-pil Yu, Suwon-si (KR); Eui-jun Park, Seoul (KR); Joon-soo Kim, Seoul (KR); Jin-hee Jeong, Anyang-si (KR); Jong-hun Kim, Suwon-si (KR); Yong-sik Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1210 days.

(21) Appl. No.: 11/416,247

(22) Filed: May 3, 2006

(65) Prior Publication Data

US 2007/0168844 A1  Jul. 19, 2007

Related U.S. Application Data

(60) Provisional application No. 60/755,068, filed on Jan. 3, 2006.

(51) Int. Cl.
*H03M 13/00* (2006.01)
(52) U.S. Cl. ...................... 714/784; 714/792
(58) Field of Classification Search ................. 714/784, 714/792; 375/295
See application file for complete search history.

(56) References Cited

U.S. PATENT DOCUMENTS 5,754,522 A    5/1998  Kobayashi et al.
6,097,695 A    8/2000  Kobayashi
6,754,872 B2   6/2004  Zhang et al.
2002/0194570 A1 * 12/2002 Birru et al. ............... 714/792
2003/0090971 A1  5/2003 Gushima et al.
2004/0091059 A1  5/2004 Chen
2004/0101046 A1  5/2004 Yang et al.
2006/0159183 A1 * 7/2006 Gaddam et al. ......... 375/240.26

FOREIGN PATENT DOCUMENTS

| JP | 8-235779 | 9/1996 |
|---|---|---|
| JP | 9-106549 | 4/1997 |
| JP | 9-212871 | 8/1997 |
| JP | 10-320774 | 12/1998 |
| JP | 11-134671 | 5/1999 |
| WO | WO 02/052551 A2 | 7/2002 |

OTHER PUBLICATIONS

International Search Report mailed on Apr. 6, 2007, in International Application No. PCT/KR2006/005872.

(Continued)

*Primary Examiner*—Sam Rizk
(74) *Attorney, Agent, or Firm*—Sughrue Mion, PLLC

(57) ABSTRACT

A digital broadcasting transmission system and method thereof. The digital broadcasting transmission system, comprises an RS encoder to encode a dual transport stream (TS) which includes a normal stream and a plurality of turbo streams multiplexed together, an interleaver to interleave the encoded dual TS, a turbo processor to detect the turbo streams from the interleaved dual TS and to encode the detected turbo stream, and a trellis encoder to pseudo2 (P-2) vestigial sideband (VSB) code the turbo-processed dual TS, and, then, to perform trellis encoding, and a main multiplexer (MUX) to multiplex the trellis-encoded dual TS by adding a field synchronous signal and a segment synchronous signal thereto.

36 Claims, 13 Drawing Sheets

OTHER PUBLICATIONS

Written Opinion of the International Searching Authority mailed on Apr. 6, 2007, in International Application No. PCT/KR2006/005872.

Search Report and written opinion issued in International Application No. PCT/KR 2006/000881 on Jun. 23, 2006.

* cited by examiner

| | | 1 | 3 | 184 |
|---|---|---|---|---|
| M0 | SYNC | PID | | TURBO DATA |
| M1 | SYNC | PID | | NORMAL DATA |
| M2 | SYNC | PID | | NORMAL DATA |
| M3 | SYNC | PID | | NORMAL DATA |
| M4 | SYNC | PID | | TURBO DATA |
| M5 | SYNC | PID | | NORMAL DATA |
| ⋮ | | | | |
| M48 | SYNC | PID | | NORMAL DATA |
| M49 | SYNC | PID | | NORMAL DATA |
| M50 | SYNC | PID | | TURBO DATA |
| M51 | SYNC | PID | | NORMAL DATA |

FIG. 5A

| SYNC | PID | NORMAL DATA |
|---|---|---|
| 1 | 3 | 184-N |

| SYNC | PID | AF Header | TURBO DATA + NULL DATA | NORMAL DATA |
|---|---|---|---|---|
| 1 | 3 | 2 | N | 182-N |

FIG. 5B

| SYNC | PID | NORMAL DATA |
|---|---|---|
| 1 | 3 | 184 |

| SYNC | PID | TURBO DATA |
|---|---|---|
| 1 | 3 | 184 |

FIG. 5C

| | 3 bytes | 2 bytes | 128 bytes | 182-128 bytes |
|---|---|---|---|---|
| 1 | Header | AF Head | 128 bytes of Turbo data | 54bytes of Normal data |
| 2 | Header | | 184 bytes of Normal data | |
| 3 | Header | | 184 bytes of Normal data | |
| 4 | Header | | 184 bytes of Normal data | |
| 5 | Header | AF Head | 128 bytes of Turbo data | 54bytes of Normal data |
| 6 | Header | | 184 bytes of Normal data | |
| 7 | Header | | 184 bytes of Normal data | |
| 8 | Header | | 184 bytes of Normal data | |
| 9 | Header | AF Head | 128 bytes of Turbo data | 54bytes of Normal data |
| 10 | Header | | 184 bytes of Normal data | |
| 11 | Header | | 184 bytes of Normal data | |
| 12 | Header | | 184 bytes of Normal data | |
| 13 | Header | AF Head | 128 bytes of Turbo data | 54bytes of Normal data |
| 14 | Header | | 184 bytes of Normal data | |
| 15 | Header | AF Head | reserved for PCR(6 bytes) | 171 bytes of Normal data |
| 16 | Header | | 184 bytes of Normal data | |
| 17 | Header | AF Head | 128 bytes of Turbo data | 54bytes of Normal data |
| 18 | Header | | 184 bytes of Normal data | |
| 19 | Header | | 184 bytes of Normal data | |
| 20 | Header | | 184 bytes of Normal data | |
| 21 | Header | AF Head | 128 bytes of Turbo data | 54bytes of Normal data |
| 22 | Header | | 184 bytes of Normal data | |
| 23 | Header | | 184 bytes of Normal data | |
| 24 | Header | | 184 bytes of Normal data | |
| 25 | Header | AF Head | 128 bytes of Turbo data | 54bytes of Normal data |
| 26 | Header | | 184 bytes of Normal data | |
| 27 | Header | | 184 bytes of Normal data | |
| 28 | Header | | 184 bytes of Normal data | |
| 29 | Header | AF Head | 128 bytes of Turbo data | 54bytes of Normal data |
| 30 | Header | | 184 bytes of Normal data | |
| 31 | Header | | 184 bytes of Normal data | |
| 32 | Header | | 184 bytes of Normal data | |
| 33 | Header | AF Head | 128 bytes of Turbo data | 54bytes of Normal data |
| 34 | Header | | 184 bytes of Normal data | |
| 35 | Header | | 184 bytes of Normal data | |
| 36 | Header | | 184 bytes of Normal data | |
| 37 | Header | AF Head | 128 bytes of Turbo data | 54bytes of Normal data |
| 38 | Header | | 184 bytes of Normal data | |
| 39 | Header | | 184 bytes of Normal data | |
| 40 | Header | | 184 bytes of Normal data | |
| 41 | Header | AF Head | 128 bytes of Turbo data | 54bytes of Normal data |
| 42 | Header | | 184 bytes of Normal data | |
| 43 | Header | | 184 bytes of Normal data | |
| 44 | Header | | 184 bytes of Normal data | |
| 45 | Header | AF Head | 128 bytes of Turbo data | 54bytes of Normal data |
| 46 | Header | | 184 bytes of Normal data | |
| 47 | Header | | 184 bytes of Normal data | |
| 48 | Header | | 184 bytes of Normal data | |
| 49 | Header | AF Head | 128 bytes of Turbo data | 54bytes of Normal data |
| 50 | Header | | 184 bytes of Normal data | |
| 51 | Header | | 184 bytes of Normal data | |
| 52 | Header | | 184 bytes of Normal data | |

| SYNC | PID | AF Header | SRS DATA | NORMAL DATA |
|------|-----|-----------|----------|-------------|
| 1 | 3 | 2 | S | 182-S |

| SYNC | PID | AF Header | SRS DATA | TURBO DATA + NULL DATA | NORMAL DATA |
|------|-----|-----------|----------|------------------------|-------------|
| 1 | 3 | 2 | S | N | 182-S-N |

| SYNC | PID | AF Header | SRS DATA | NORMAL DATA |
|------|-----|-----------|----------|-------------|
| 1 | 3 | 2 | S | 182-S |

| SYNC | PID | AF Header | SRS DATA | TURBO DATA |
|------|-----|-----------|----------|------------|
| 1 | 3 | 2 | S | 182-S |

DIGITAL BROADCASTING TRANSMISSION SYSTEM AND METHOD THEREOF

CROSS-REFERENCE TO RELATED APPLICATIONS

This application claims the benefit of U.S. Provisional Application No. 60/755,068 filed Jan. 3, 2006, in the United States Patents and Trademark Office, the disclosure of which is incorporated herein by reference.

BACKGROUND OF THE INVENTION

1. Field of the Invention

An aspect of the present invention relates to a digital broadcasting transmission system and a method thereof. More particularly, an aspect of the present invention relates to a digital broadcasting transmission system enabling an improved receptivity, by using a variety of methods to code a turbo stream, and a method thereof.

2. Description of the Related Art

According to the Advanced Television System Committee (ATSC) Digital Vestigial Side Band (VSB) technologies, the U.S. oriented terrestrial digital broadcasting system uses a single carrier and field sync signal of 312-segment unit. This system has poor receptivity particularly in the bad channel such as Doppler fading channel.

FIG. 1 is a block diagram of a conventional ATSC VSB broadcasting transmission apparatus, and FIG. 2 shows the frame structure of data used in the system of FIG. 1.

More specifically, FIG. 1 shows an EVSB system, which makes and sends out a dual transport stream (TS) by adding robust data to the normal data of an existing ATSC VSB system.

Referring to FIG. 1, the transmission of the conventional digital broadcasting transmission system is explained below.

A normal stream, a place holder packet and a turbo stream are fed to a TS constructor 11 in which a dual TS is constructed.

The dual TS is randomized at the randomizer 13, a parity bit is appended to the transmitted stream for error correction at a Reed-Solomon (RS) encoder 15, and a packet is re-constructed at a packet formatter 17. Additionally, the re-constructed packet is interleaved at an interleaver 19, and the interleaved data is trellis-encoded at a trellis encoder 21. The trellis encoder 21 generates a compatible parity bit through an interaction with a compatible parity generator 23.

After the data is error-corrected at the trellis encoder 21, the error-corrected data is multiplexed at a multiplexer (MUX) 27 which inserts field sync and segment sync signals in the data. Then the processes of pilot signal insertion, VSB conversion and up-conversion to RF channel signal levels, are performed and the data is transmitted through the channel. The above operations may be controlled by the control signal from a controller 25.

As shown in FIG. 2, a data frame that is applied to the digital broadcasting transmission apparatus of FIG. 1 has consecutive packets M0 through M51, and is formatted at a packet formatter 17 and outputted. As shown, the turbo stream and the normal stream are arranged at the rate of 1:3.

A problem of the VSB system is performance degradation due to dynamic multipath interference and a weak signal. However, notwithstanding the fact that they use a dual TS which includes normal stream added with turbo stream, the conventional digital broadcasting transmission systems, as the ones shown in FIGS. 1 and 2, could hardly improve bad receptivity by the transmission of a normal stream in the multipath channel.

Additionally, at relatively high power levels, that is, as 4th level power used among the existing 8 levels of power, average power consumption of the stream increases. If many turbo streams are used, quality of normal stream will relatively deteriorate. Therefore, adding a turbo stream to the normal stream has to be limited.

SUMMARY OF THE INVENTION

An Aspect of the present invention is to provide a digital broadcasting transmission system which is capable of adding as many turbo streams as is necessary, without being limited to a certain rate, by applying P2-VSB coding to the turbo stream.

In accordance with the above aspect of the present invention, the digital broadcasting transmission system, comprises an RS encoder to encode a dual transport stream (TS) which includes a normal stream and a plurality of turbo streams multiplexed together, an interleaver to interleave the encoded dual TS, a turbo processor to detect the turbo streams from the interleaved dual TS and to encode the detected turbo stream, and a trellis encoder to pseudo2 (P-2) vestigial sideband (VSB) code the turbo-processed dual TS, and, then, to perform trellis encoding, and a main multiplexer (MUX) to multiplex the trellis-encoded dual TS by adding a field synchronous signal and a segment synchronous signal thereto.

In accordance with another aspect of the present invention, a digital broadcasting transmission method, comprises encoding a dual transport stream (TS) which includes a normal stream and a plurality of turbo streams that are multiplexed together; interleaving the encoded dual TS, detecting the turbo streams from the interleaved dual TS and encoding the detected turbo stream, and pseudo2 (P-2) VSB coding the turbo-processed dual TS, and then performing trellis encoding, and multiplexing the trellis-encoded dual TS by adding a field synchronous signal and a segment synchronous signal thereto.

Additional and/or other aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 5A through 5C are views illustrating a packet output from the TS constructor;

FIG. 8 illustrates a first encoder of FIG. 7;

FIGS. 10 and 10B show transmission stream which includes SRS data;

DETAILED DESCRIPTION OF THE EMBODIMENTS

Figure 1:
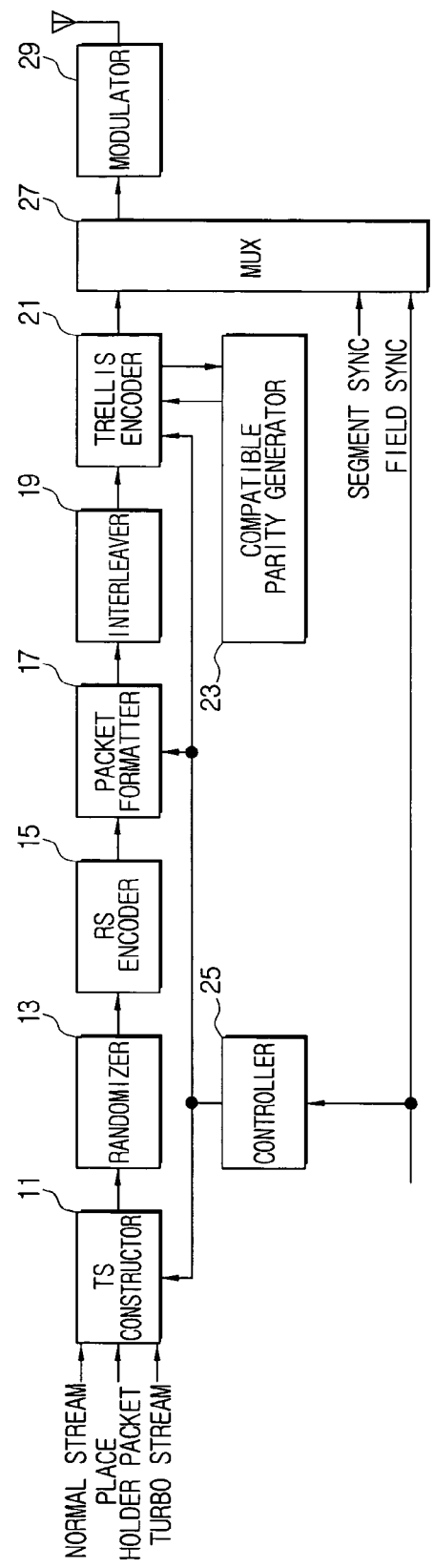
FIG. 1 is a block diagram of a conventional ATSC digital broadcasting transmission system.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
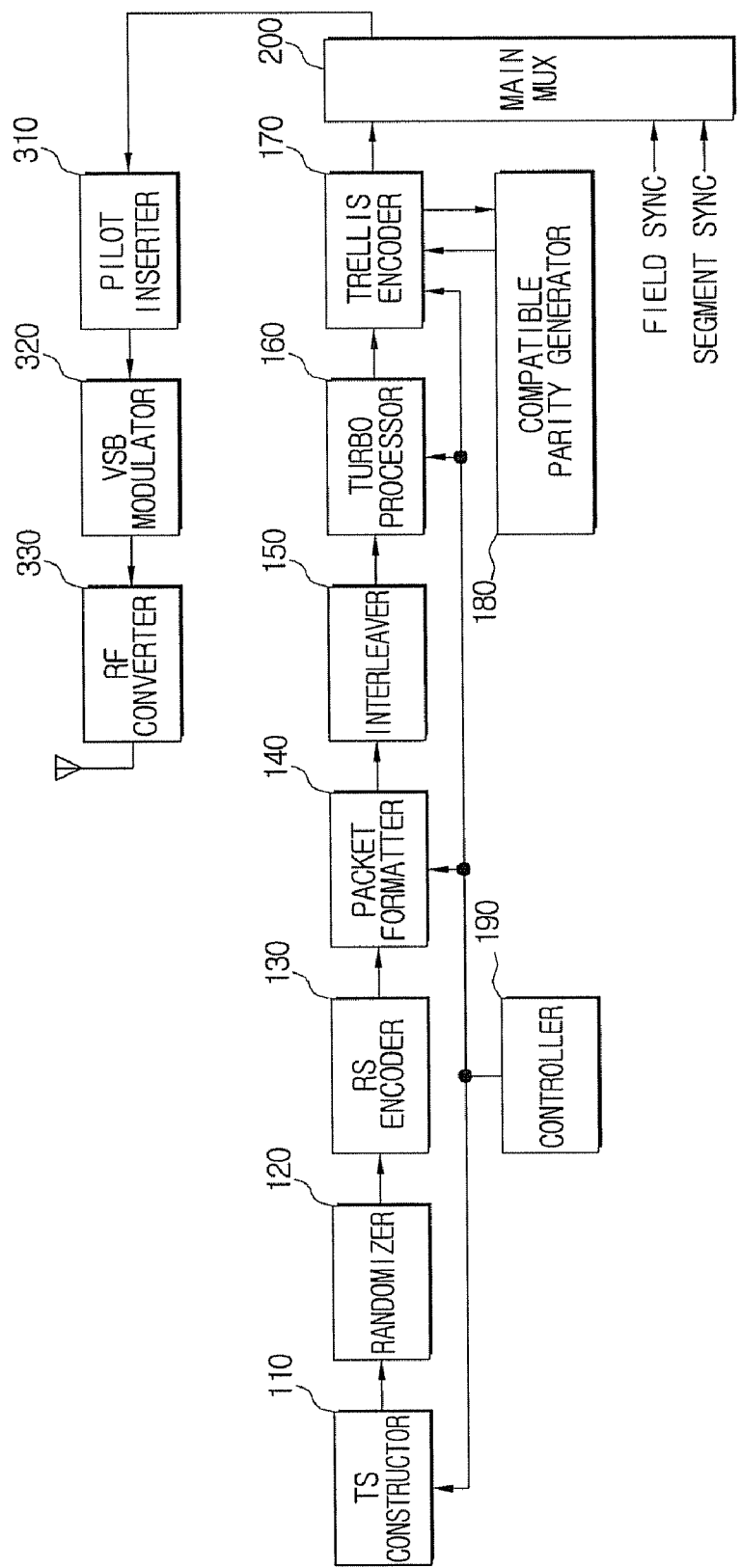
FIG. 3 is a block diagram of a digital broadcasting transmission system according to an exemplary embodiment of the present invention.

FIG. 3 is a block diagram of a digital broadcasting transmission system according to an exemplary embodiment of the present invention. As shown in FIG. 3, a digital broadcasting system according to an exemplary embodiment of the present invention includes a TS constructor 110, a randomizer 120, an RS encoder 130, a parity formatter 140, an interleaver 150, a turbo processor 160, a trellis encoder 170, a compatible parity generator 180, a controller 190, a main multiplexer (MUX) 200, a pilot inserter 310, a vestigial sideband (VSB) modulator 320, and a radio frequency (RF) converter 330.

The TS constructor 110 receives an input of a normal stream and a plurality of turbo streams, and processes the turbo streams from among the received data. The TS constructor 110 then multiplexes the normal stream and the turbo stream to construct a dual transport stream (TS). The TS constructor 110 will be explained in greater detail below with reference to FIGS. 4, 5A, 5B and 5C.

The randomizer 120 randomizes the dual TS received from the TS constructor 110. By the operation of the randomizer 201, a utilization of channel space is increased.

The RS encoder 130 encodes the dual TS which is randomized at the randomizer 120. The RS encoder 130 may be implemented as a concatenated coder which adds a parity bit to the transmission stream in order to correct a channel-generated error during the transmission.

The parity formatter 140 determines the position of the parity bit in the RS encoded dual TS. Therefore, the parity formatter 140 does not operate with respect to the packet having normal data only, but, rather, determines the position of the packet having turbo data, in order to prevent the parity bit from proceeding to the turbo data position after the interleaving.

With reference to an example of the packet as shown in FIG. 5B, the parity formatter 140 changes the parity bit to predetermined data. The parity formatter 140 calculates the position of the parity bit by the following:

[Mathematical Expression]

$m = (52 * n + k) \% 207$ where, m refers to the position of a parity bit before interleaving, n is the position of parity bit after interleaving (n=0, 1, ..., 206), and k is the result of calculating the order of packets in a field by module 52 (k=0, 1, ..., 51).

The above mathematical expression is used to calculate the value of m from 187 to 206, and does not take the result if the parity bit is located in the PID, AF header and normal data. The position of the parity bit is determined by iteratively applying the above mathematical expression while changing the starting position one by one.

Taking the example of the 10$^{th}$ segment which includes 128 byte turbo data, and 54 byte normal data, the parity bit overlaps the PID, AF header and normal data by 21 bytes. In this case, the position of the parity bit is calculated by applying the above mathematical expression 1 to 176 to 206 and a 20 byte parity bit position is determined.

Accordingly, the parity formatter 140 first inserts predetermined data to the position of the parity bit excluding the PID, AF header and normal data, and then inserts turbo data in the remaining parts, to construct a new packet structure.

The interleaver 150 interleaves the dual TS. The 'interleaving' changes the position of the data in frame but does not change the data, per se.

The turbo processor 160 separates the normal stream and the turbo stream from the dual TS which is interleaved at the interleaver 150, and encodes the separated turbo stream to strengthen the turbo stream. The turbo processor 160 will be explained in greater detail below with reference to FIGS. 7 and 8.

The trellis encoder 170 pseudo 2-VSB (P-2 VSB) codes the turbo-processed dual TS, and performs trellis encoding. The trellis encoder 170 will be explained in greater detail below with reference to FIGS. 9 and 10.

The compatible parity generator 180 generates a compatible parity bit for the compatibility with a receiver device, through an interaction with the trellis encoder 170. The compatible parity generator 180 may generate a compatible parity bit based on the dual TS packet, which is appended with the parity at the RS encoder 130, and the dual TS, which is encoded at the trellis encoder 170.

The controller 190 controls the normal stream and the turbo stream at the TS constructor 110, the parity formatter 140, the turbo processor 160 and the trellis encoder 170 according to a predetermined control signal.

The main MUX 200 appends field sync and segment sync signals to the dual TS provided from the trellis encoder 170, to multiplex the streams.

According to one aspect of the present invention, the turbo stream processed at the turbo processor 160, the turbo stream processed at the turbo processor 160 and P2-VSB coded at the trellis encoder 170, the turbo stream processed at the turbo processor 160, and the turbo stream P2-VSB coded and trellis encoded at the trellis encoder 170, and the normal stream may all be multiplexed.

The pilot inserter 310 appends a pilot signal to the dual TS which is appended with the field sync and segment sync signals at the main MUX 200. The pilot signal appears as a relatively small DC phase voltage is applied to an 8-VSB base band immediately before the modulation, so that a relatively small carrier appears in the zero frequency point of the modulated spectrum. The pilot signal synchronizes the signal to the RF PLL circuit of the receiver device, regardless of the transmission signal.

The VSB modulator 320 pulse-shapes the transmission stream which is appended with the pilot signal at the pilot inserter 310, and loads the transmission stream to the intermediate frequency carrier so as to perform VSB modulation which modulates amplitude.

The RF converter 330 RF-converts the VSB-modulated transmission stream at the VSB modulator 320, and amplifies and transmits the transmission stream to a predetermined band through an allotted channel.

Figures 2, 4:
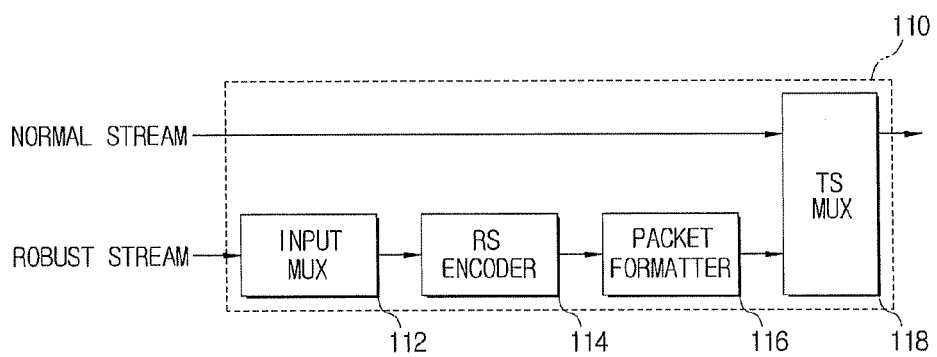
FIG. 2 illustrates the frame structure of data used in the system of FIG. 1.
FIG. 4 is a block diagram of the TS constructor of FIG. 3.

FIG. 4 is a block diagram of the TS constructor of FIG. 3. As shown in FIG. 4, the TS constructor 110 applied to the digital broadcasting transmission system according to one exemplary embodiment of the present invention includes an input MUX 112, an RS encoder 114, a packet formatter 116 and a TS MUX 118. The input MUX 112 multiplexes a plurality of turbo streams which are inputted to the TS constructor 110. One of the plurality of turbo streams goes through the turbo coding, another goes through the P2-VSB coding, and another goes through the turbo coding and then P2-VSB coding. The RS encoder 114 RS-encodes the turbo stream, which is multiplexed at the input MUX 112. The packet formatter 116 re-constructs the packet of the turbo stream which is RS-encoded at the RS encoder 114. The TS MUX 118 multiplexes the turbo stream whose packet is reconstructed at the packet formatter 116, with the normal stream, and, thus, constructs a dual TS.

FIGS. 5A through 5C are views to show an exemplary packet being outputted from the TS constructor 110.

Generally, a packet applied to the digital broadcasting includes a 1-byte synchronous signal, a 3-byte header and a 184-byte payload. The header of the packet includes a packet identifier (PID). The data in the payload is categorized into either a normal stream and/or at least one turbo stream according to the type of data included in the payload.

As shown in FIG. 5A, the normal stream (a) is inputted to the TS constructor 100, and the normal data (b) is included in the payload part. Additionally, there is an adaptation field showing the normal data mixed with the turbo data. The adaptation field includes 2-byte AF header and (N)-byte turbo data+null data space. FIG. 5B shows the two packets having a turbo stream and a normal stream, respectively, which may be combined with each other at the TS constructor at the rate of 1:3 or 2:2. FIG. 5C shows an exemplary structure of the packet corresponding to one field which is constructed in the form as shown in FIG. 5B at the TS constructor 110, and which is inputted to the randomizer 120. The normal data and the turbo data are combined in the 3:1 rate.

Figure 6:
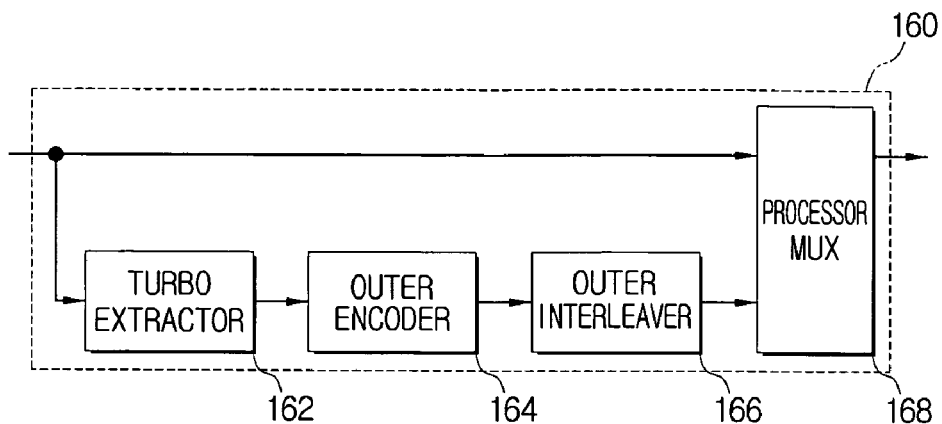
FIG. 6 is a block diagram of the turbo processor of FIG. 3.

FIG. 6 is a block diagram of the turbo processor of FIG. 3. As shown in FIG. 6, the turbo processor 160 applied to the digital broadcasting transmission system of the present invention includes a turbo extractor 162, an outer encoder 164, an outer interleaver 514 and a processor MUX 168. The turbo extractor 162 extracts a turbo stream from the dual TS which is inputted to the turbo processor 160. The outer encoder 164 performs convolution encoding with respect to the turbo stream which is extracted at the turbo extractor 162. The outer interleaver 514 interleaves the turbo stream which is convolution-encoded at the outer encoder 164. The processor MUX 168 multiplexes the turbo stream and the normal stream interleaved at the outer interleaver 514, and outputs the resultant stream.

Figure 7:
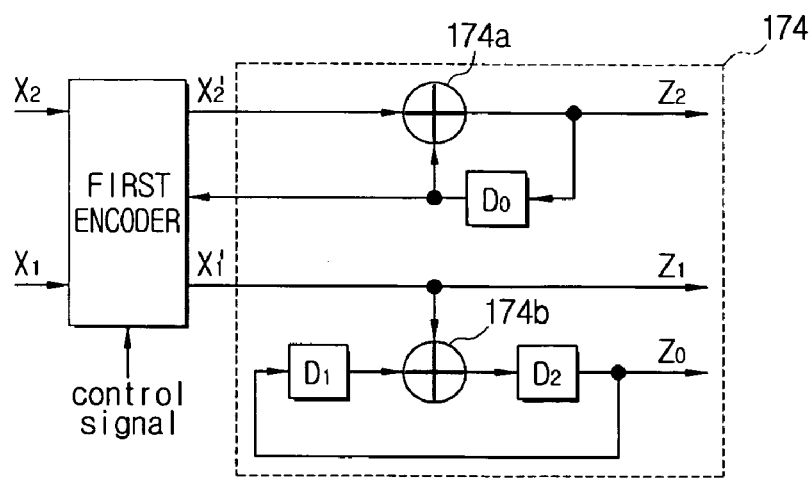
FIG. 7 illustrate inner structure of a trellis encoder of FIG. 3.
Figures 8, 10A, 10B:
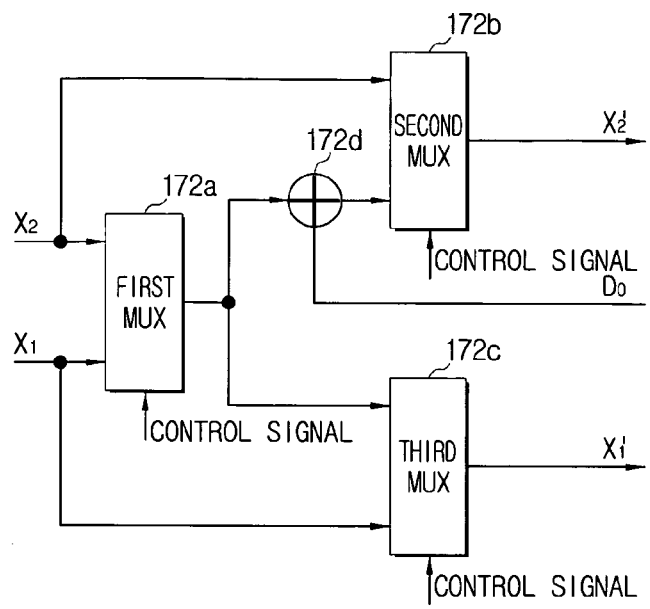

FIG. 7 shows the inner structure of the trellis encoder of FIG. 3, and FIG. 8 shows the first encoder. As shown in FIG. 7, the trellis encoder 170 includes a first encoder 172 for P-2 VSB coding, and a second encoder 174 for general trellis encoding.

Referring to FIG. 8, as shown in FIG. 8, the first encoder 172 includes a first MUX 172a, a second MUX 172b, a third MUX 172c, a first adder 172d and a control signal generator (not shown). The first MUX 172a selectively outputs one among the first and the second inputs $X_1$ and $X_2$. The first input $X_1$ is also inputted to the second MUX 172b. The first adder 172d adds the output from the first MUX 172a and the input from a predetermined register $D_0$, and outputs the resultant value. The register $D_0$ may be the first register of the second encoder. The second MUX 172b selectively outputs one among the first input $X_1$ and the output from the first adder 172d. The output $X_2'$ of the second MUX 172 is input to the second encoder 174. The third MUX 172c selectively outputs either the second input $X_2$ or the output of the first MUX 172. The output $X_1'$ of the third MUX 172c is input to the second encoder.

The control signal generator (not shown) provides a control signal to select one among the plurality of inputs from the first through third MUXes 172a through 172c.

Accordingly, the first encoder 172 removes a pre-coding effect so that two outputs of the trellis encoding, with respect to the data for P-2 VSB coding among the plurality of turbo streams inputted to the TS constructor, may have the same value.

The second encoding is processed using the outputs from the first encoder 172, as the one shown in FIG. 8. Referring to FIG. 7, the second encoder 174 includes first through third registers $D_0$, $D_1$, $D_2$, the second adder 174a and the third adder 174b.

The first through third registers $D_0$, $D_1$, $D_2$ have predetermined bit-values.

The second adder 174a adds one $X_2'$ among the outputs from the first encoder, with the stored value of the first register $D_0$, and outputs the resultant data and stores the output $Z_2$ in the first register $D_0$.

The third adder 174b adds another one $X_1'$ among the outputs from the first encoder, with the stored value of the second register $D_1$, and outputs the resultant data and stores the output $Z_0$ in the first register $D_0$.

According to one exemplary embodiment of the present invention, as the data go through the processes of turbo coding at the turbo processor 160 and the P-2 VSB coding at the first encoder 172, new data, which is different from the conventional packet data, is formed. Accordingly, incorrect RS decoding is possible at the receiver device. In order to prevent incorrect RS decoding, the compatible parity generator 180 generates a compatible parity bit to be inserted in the parity bit location of the data from the first encoder 172.

Figure 9:
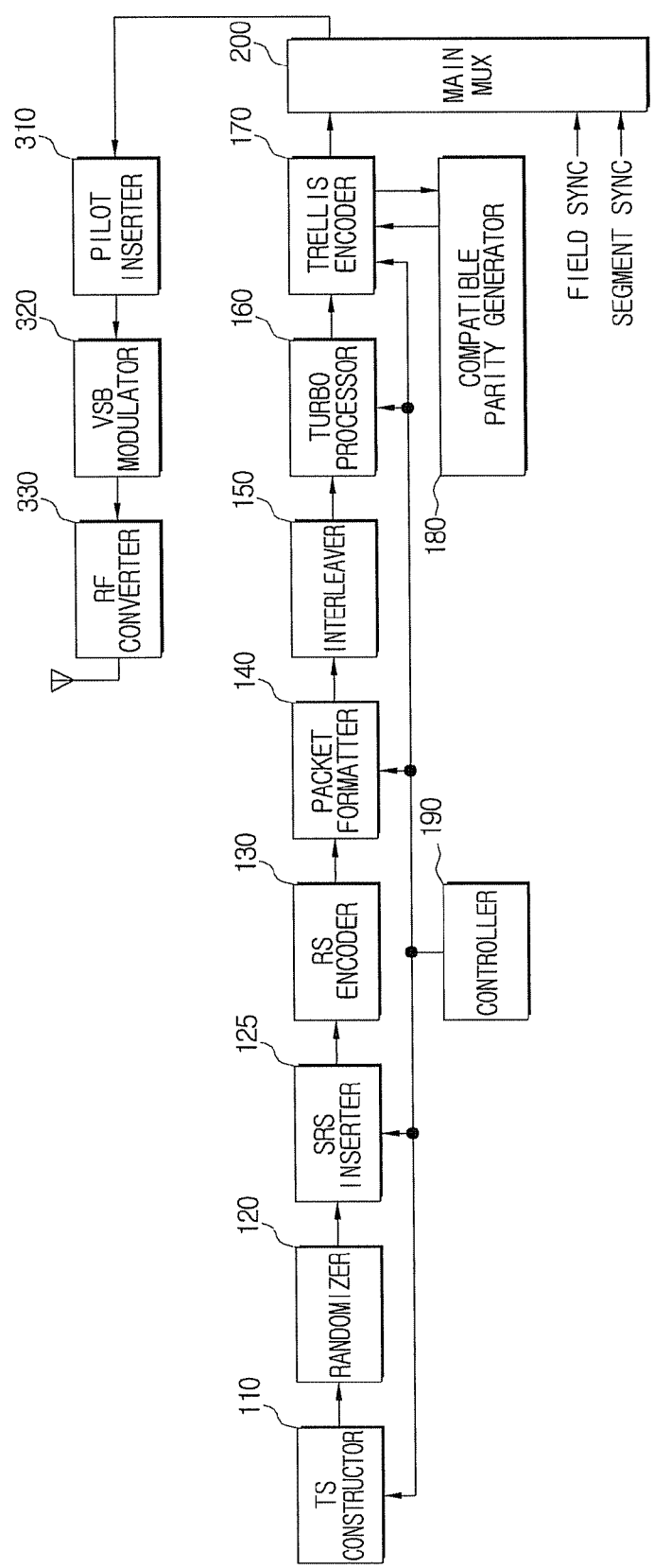
FIG. 9 is a block diagram of a digital broadcasting transmission system according to another exemplary embodiment of the present invention.

FIG. 9 is a block diagram of a digital broadcasting transmission system according to another exemplary embodiment of the present invention. FIGS. 10A through 10B show the transmission stream including supplementary reference signal (SRS) data therein.

As shown in FIG. 9, the digital broadcasting transmission system according to another exemplary embodiment of the present invention includes a TS constructor 110, a randomizer 120, an SRS inserter 125, an RS encoder 130, a parity formatter 140, an interleaver 150, a turbo processor 160, a trellis encoder 170, a compatible parity generator 180, a controller 190, a main MUX 200, a pilot inserter 310, a VSB modulator 320 and an RF converter 330.

The digital broadcasting transmission system according to this exemplary embodiment of the present invention has a similar structure as the one shown in FIG. 3. Accordingly, the like elements are given the same reference numerals and only the different parts of the embodiment will be explained below.

From the packet including adaptation field as shown in FIG. 5A, a dual TS, which includes a stuffing region in the adaptation field, is inputted to the randomizer 120.

The SRS inserter 125 inserts a supplementary reference signal (SRS) to the stuffing region of the dual TS which is randomized at the randomizer 120. According to the AF header and the stuff bytes inserted in the dual TS, a loss of payload due to the SRS and a mixing rate may be determined. This will be explained in greater below with reference to the SRS inserter 125 as shown in FIG. 11.

FIGS. 10A and 10B show the packet which includes SRS data inserted by the SRS inserter 125. As shown, both the normal stream and the robust stream include S-byte of SRS data.

Explanation of the remaining elements will be omitted for the sake of brevity, as it has already been explained above with reference to FIG. 3.

Figure 11:
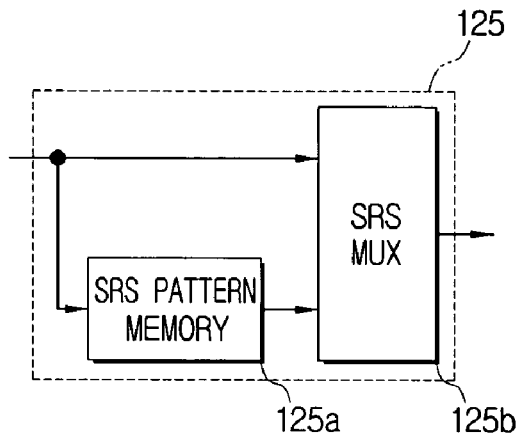
FIG. 11 is a block diagram of a SRS inserter of FIG. 9.

FIG. 11 is a block diagram of the SRS inserter of FIG. 9. As shown in FIG. 11, the SRS inserter 125 includes an SRS pattern memory 125a, and an SRS MUX 125b. The SRS pattern memory 125a stores an SRS pattern for insertion in the stuffing region. The SRS pattern is made compatible with the receiver device in advance, and can be used in the equalizer of the receiver device. The SRS MUX 125b adds the SRS pattern stored in the SRS pattern memory 125a, to the normal stream and the turbo stream, to perform multiplexing.

Figure 12:
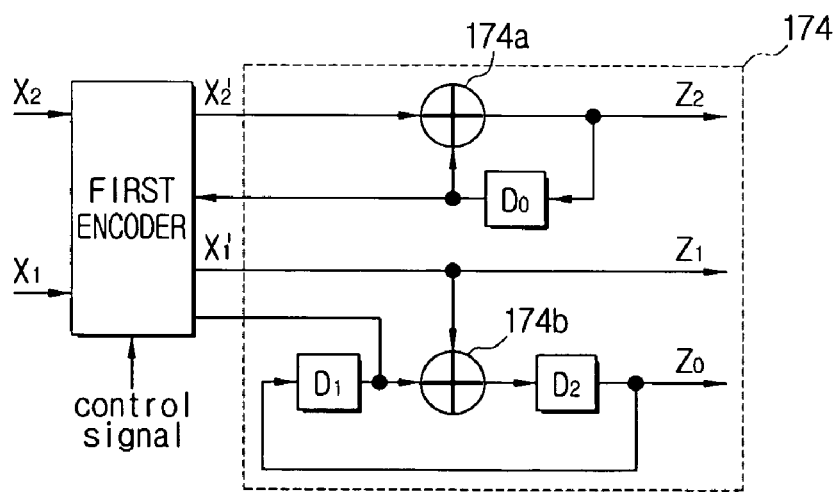
FIG. 12 illustrates a trellis encoder of FIG. 9.
Figure 13:
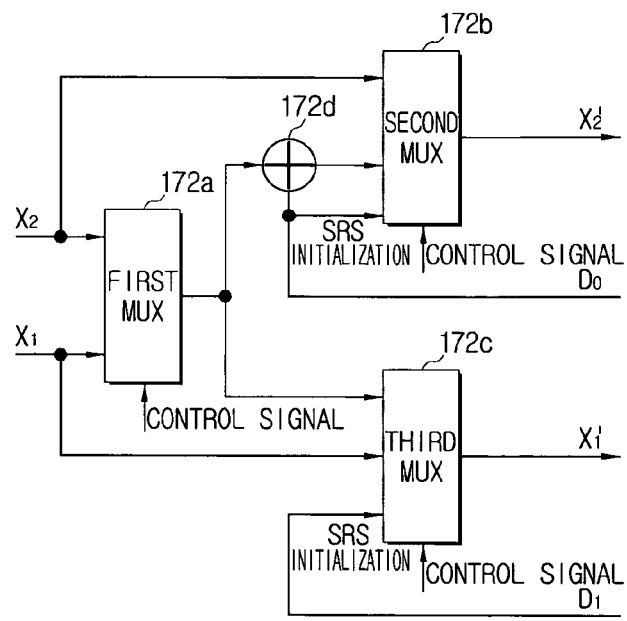
FIG. 13 illustrates a first encoder of FIG. 12.

FIG. 12 shows the trellis encoder of FIG. 9, and FIG. 13 shows the first encoder of FIG. 12. As shown in FIG. 12, the trellis encoder 170 according to one exemplary embodiment of the present invention includes a first encoder 172 and a second encoder 174. The second encoder 174 includes first through third registers $D_0$, $D_1$, $D_2$, a second adder 174a, and a third adder 174b, in the identical structure as the second encoder as shown in FIG. 7. The first encoder 172 of FIG. 13 includes first through third MUXes 172a through 172c, and the first adder 172b, in the same structure as the first encoder 172 as shown in FIG. 8.

A difference of this embodiment from other embodiments of the present invention is in the P-2 VSB coding of the first encoder 172, which is performed before the trellis encoding of the second encoder 174. The SRS initialization signal is inputted to the second and the third MUXes 172b, 172c. The SRS initialization signal initializes the first through third registers $D_0$, $D_1$, $D_2$ of the second encoder 174, that is, $D_0=D_1=D_2=0$.

Figure 15A:
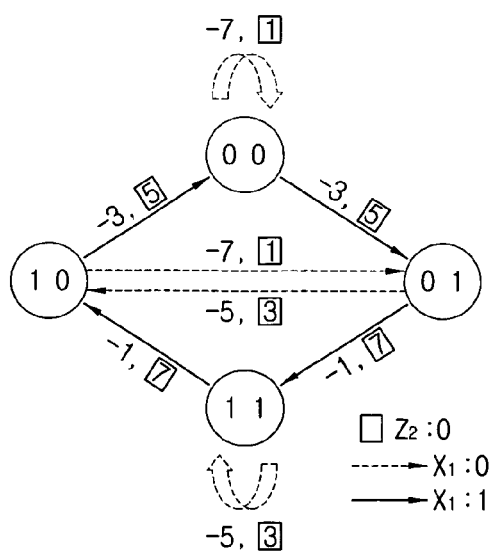
FIGS. 15A and 15B are diagrams showing the operation of viterbi decoder of FIG. 14.
Figure 15B:
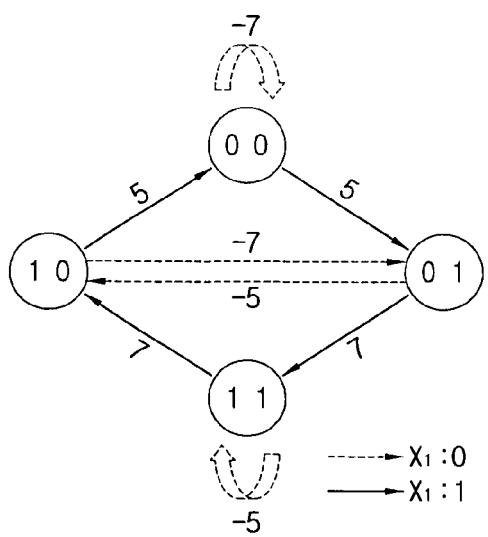
Figure 14:
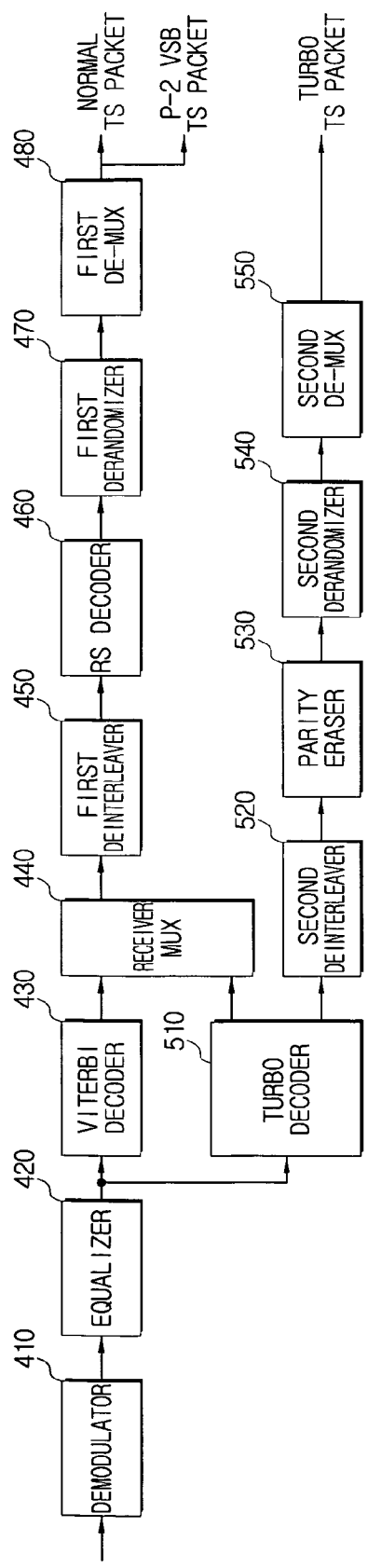
FIG. 14 is a block diagram of a digital broadcasting reception system applied to the present invention.

FIG. 14 is a block diagram of a digital broadcasting reception system applied to the present invention, and FIGS. 15A and 15B are diagrams showing the viterbi decoder in use. As shown in FIG. 14, the digital broadcasting reception system includes a demodulator 120, an equalizer 420, a viterbi decoder 430, a receiver MUX 440, a first deinterleaver 450, an RS decoder 460, a first derandomizer 470, a first de-MUX 480, a turbo decoder 510, a second deinterleaver 150, a parity eraser 530, a second derandomizer 540, and a second de-MUX 550.

The demodulator 410 receives dual TS which is transmitted from the digital broadcasting transmission system as shown in FIG. 3 or FIG. 9, detects synchronization according to the synchronous signal added to the baseband signal, and performs demodulation.

The equalizer 420 equalizes the dual TS which is demodulated at the demodulator 410. Accordingly, the equalizer 420 compensates for channel distortion due to multipath of the channel, and, thus, removes interferences of the received symbols.

The viterbi decoder 430 corrects errors of the normal stream of the dual TS, decodes the error-corrected symbol, and, thus, outputs a symbol packet. The viterbi decoder 430 decodes the normal data using the diagram as shown in FIG. 15A, while decoding P-2 VSB-coded data using the diagram as shown in FIG. 15B.

The receiver MUX 440 multiplexes the normal stream which is error-corrected at the viterbi decoder 430, and the turbo stream which is decoded at the turbo decoder 510.

The first deinterleaver 450 deinterleaves the normal stream which is viterbi-decoded at the viterbi decoder 430.

The RS decoder 460 RS-decodes the normal stream which is deinterleaved at the first deinterleaver 450.

The first derandomizer 470 derandomizes the normal stream which is RS-decoded at the RS decoder 460, and outputs the resultant stream.

The turbo decoder 510 decodes the turbo stream of the dual TS which is equalized at the equalizer 420. The turbo decoder 510 will be explained in greater detail below with reference to FIG. 16.

The second deinterleaver 150 deinterleaves the turbo stream which is decoded at the turbo decoder 510.

The parity eraser 530 removes a parity bit, which is appended to the turbo stream deinterleaved at the second deinterleaver 150.

The second derandomizer 540 derandomizes the turbo stream from which parity is removed at the parity eraser 530.

The second de-MUX 550 demultiplexes the turbo stream which is derandomized at the second derandomizer 540.

Figure 16:
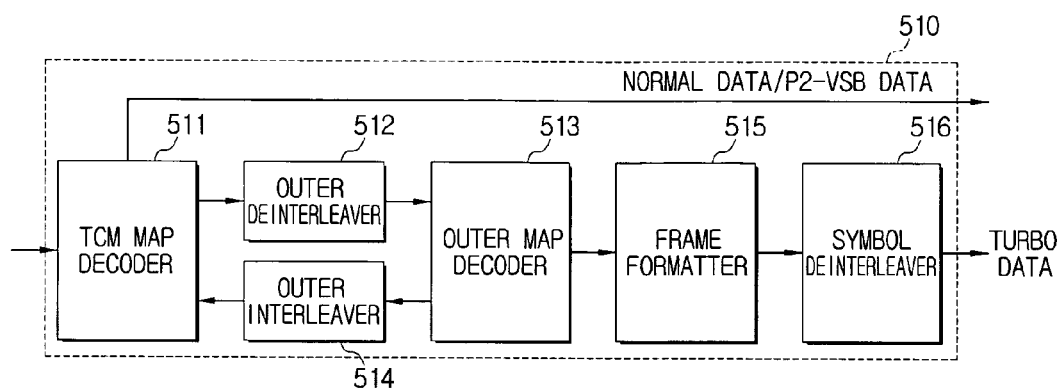
FIG. 16 is a block diagram of a turbo decoder of FIG. 14.

FIG. 16 is a block diagram of turbo decoder of FIG. 14. As shown in FIG. 16, the turbo decoder 510 includes a TCM map decoder 511, an outer deinterleaver 512, an outer map decoder 513, an outer interleaver 514, a frame formatter 515, and a symbol deinterleaver 516. The TCM map decoder 511 trellis-decodes the turbo stream. The outer deinterleaver 512 deinterleaves the turbo stream which is trellis-decoded at the TCM map decoder 511. The outer map decoder 513 convolution-decodes the turbo stream which is deinterleaved at the outer deinterleaver 512. The outer interleaver 514 interleaves the turbo stream which is convolution-decoded at the outer map decoder 513

The frame formatter 515 adds the decoding data of the outer map decoder 513 to a location of the frame having the normal stream and the turbo stream mixed therein, corresponding to the location of the turbo stream.

When information exchange is completed between the outer deinterleaver 512 and the outer interleaver 514 of the TCM map decoder 511 and the outer map decoder 513, the decoding data of the TCM map decoder 511 is outputted to use in the reception of normal stream, while the decoding data of the outer map decoder 513 is provided to the frame formatter 515.

Figure 17:
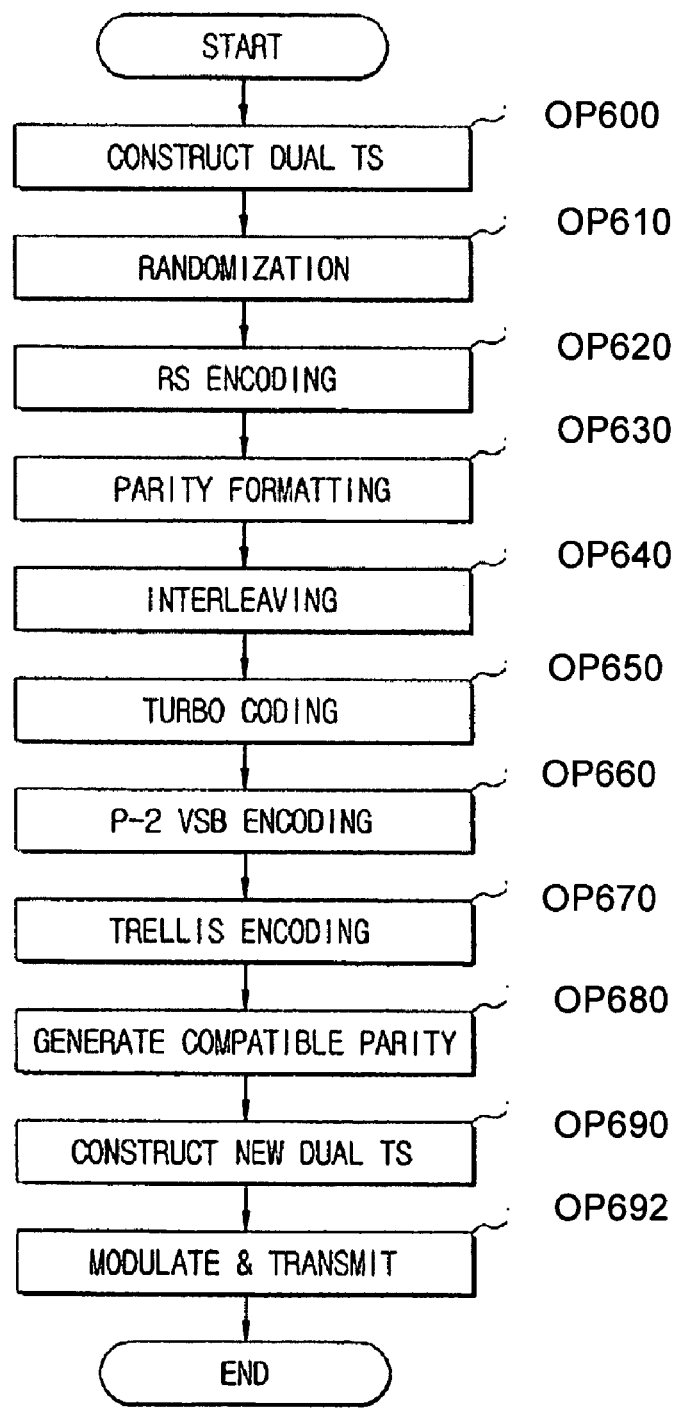
FIG. 17 is a flowchart provided to explain a method of digital broadcasting transmission according to an exemplary embodiment of the present invention.

FIG. 17 is a flowchart provided to explain a method of digital broadcasting transmission according to an exemplary embodiment of the present invention.

Hereinbelow, the digital broadcasting reception method according to the exemplary embodiment of the present invention will be explained with reference to FIGS. 3 through 17.

The TS constructor 110 receives an input of a normal stream and a plurality of turbo streams, and performs RS-encoding and packet formatting with respect to the turbo streams. The TS constructor 110 then multiplexes the processed turbo streams and the normal stream, to construct a dual transport stream (TS) (op 600).

The dual TS constructed at the TS constructor 110 is randomized at the randomizer 120 (op 610), RS-encoded at the RS encoder 130 (op 620), determined with the location of parity at the parity formatter 140 and formatted (op 630), and interleaved at the interleaver 150 (op 640).

The interleaved dual TS is separated into the normal stream and the turbo streams at the turbo processor 160, and the turbo streams are turbo-coded (op 650).

After the turbo coding, the trellis encoder 170 performs P-2 VSB coding with the first encoder 172, and trellis encoding with the second encoder 174. At this time, through the interaction of the trellis encoder 170 and the compatible parity generator 180, a compatible parity may be generated (op 660 to op 670).

Accordingly, the turbo-processed turbo stream, the turbo stream which is turbo-processed, P-2 VSB-coded at the trellis encoder 170, and the turbo stream which is turbo processed, P-2 VSB coded and trellis-encoded at the trellis encoder 170, are formed, and the three types of turbo streams are multiplexed with the normal stream at the main MUX 200 and constructed into a new dual TS (op 690).

After the dual TS constructed at the main MUX 200 goes through the process in which a pilot signal is inserted by the pilot inserter 310, and the processes of VSB modulation at the VSB modulator 320, and RF conversion at the RF converter 330, the dual TS is transmitted through the predetermined channel (op 692).

As is described above, the dual TS transmitted from the digital broadcasting transmission system is received at the digital broadcasting reception system, and goes through the processes such as modulation, equalization, viterbi decoding, deinterleaving, RS decoding, derandomization and de-MUX-ing, and is thus recovered to the normal TS packet, the P-2 VSB TS packet, and the turbo TS packet.

As is described above, the digital broadcasting transmission system and method thereof receives a normal stream and a plurality of turbo streams, applies a variety of coding methods, and, therefore, is able to add turbo streams without being limited to a certain mixing rate. Additionally, data reception at the poor channel environment is also improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting transmission system, comprising:
   an RS encoder to encode a dual transport stream (TS) which includes a normal stream and a plurality of turbo streams multiplexed together;
   an interleaver to interleave the encoded dual TS;
   a turbo processor to detect the turbo streams from the interleaved dual TS and to encode the detected turbo streams; and
   a trellis encoder to pseudo2 (P-2) vestigial sideband (VSB) code the turbo-processed dual TS, and, then, to perform trellis encoding; and
   a main multiplexer (MUX) to multiplex the trellis-encoded dual TS by adding a field synchronous signal and a segment synchronous signal thereto.

2. The digital broadcasting transmission system of claim 1, further comprising a TS constructor to receive the normal stream and the plurality of turbo streams, to process the plurality of turbo streams, and to construct the dual TS with the normal stream and the plurality of turbo streams included therein.

3. The digital broadcasting transmission system of claim 2, wherein the TS constructor comprises:
   an input MUX to multiplex the plurality of turbo streams;
   an RS encoder to RS-encode the multiplexed turbo streams;
   a packet formatter to reconstruct a packet of the RS-encoded turbo streams; and
   a TS MUX to multiplex the re-constructed turbo streams and the normal stream.

4. The digital broadcasting transmission system of claim 1, wherein the main MUX multiplexes a first turbo stream, of the plurality of turbo streams, which is turbo processed, a second turbo stream, of the plurality of turbo streams, which is turbo processed and then pseudo 2 VSB-coded at the trellis encoder, a third turbo stream, of the plurality of turbo streams, which is turbo processed, and pseudo 2 VSB-coded and trellis encoded at the trellis encoder, and the normal stream.

5. The digital broadcasting transmission system of claim 1, wherein the trellis encoder comprises a first encoder to pseudo 2-VSB code the turbo streams, and a second encoder to trellis-encode the first-encoded dual TS.

6. The digital broadcasting transmission system of claim 5, wherein the first encoder comprises:
   a first MUX to selectively output one among first and second inputs;
   a first adder to add the output of the first MUX with an input from a register and to output the resultant data;
   a second MUX to selectively output one among the first input and an output of the first adder; and
   a third MUX to selectively output one among the second input and an output from the first MUX.

7. The digital broadcasting transmission system of claim 6, further comprising a control signal generator to generate a control signal to control outputs from the first through third MUXes.

8. The digital broadcasting transmission system of claim 5, wherein the second encoder comprises:
   first through third registers to store predetermined data;
   a second adder to add one among the outputs from the first encoder with a stored data of the first register, to outputting the resultant data, and to store the output data in the first register; and
   a third adder to add the other of the outputs of the first encoder with the stored data of the second register, to output the resultant data, and to store the outputted data in the third register.

9. The digital broadcasting transmission system of claim 8, wherein the stored data in the first register is inputted to the first encoder by the second adder.

10. The digital broadcasting transmission system of claim 1, further comprising a supplementary reference signal (SRS) inserter to insert a supplementary reference signal to the encoded dual TS.

11. The digital broadcasting transmission system of claim 10, wherein the main MUX multiplexes the turbo stream, which is turbo processed, the turbo stream, which is turbo processed and then pseudo 2 VSB-coded at the trellis encoder, the turbo stream which is turbo processed, pseudo 2 VSB-coded and trellis encoded at the trellis encoder, the turbo stream in which the supplementary reference signal is inserted, and the normal stream.

12. The digital broadcasting transmission system of claim 1, further comprising a parity formatter to determine the location of a parity bit in the dual TS.

13. The digital broadcasting transmission system of claim 1, further comprising a compatible parity bit generator to generate a compatible parity bit for compatibility with a receiver device, through interaction with the trellis encoder.

14. A digital broadcasting transmission method, comprising:
   encoding a dual transport stream (TS) which includes a normal stream and a plurality of turbo streams that are multiplexed together;
   interleaving the encoded dual TS;
   detecting the turbo streams from the interleaved dual TS and encoding the detected turbo streams; and
   pseudo2 (P-2) VSB coding the turbo-processed dual TS, and then performing trellis encoding; and multiplexing the trellis-encoded dual TS by adding a field synchronous signal and a segment synchronous signal thereto.

15. The digital broadcasting transmission method of claim 14, further comprising:
receiving the normal stream and the plurality of turbo streams;
processing the plurality of turbo streams; and
constructing the dual TS with the normal stream and the plurality of turbo streams.

16. The digital broadcasting transmission method of claim 15, wherein the constructing of the dual TS comprises:
multiplexing the plurality of turbo streams;
RS-encoding the multiplexed turbo streams;
reconstructing a packet of the RS-encoded turbo streams; and
multiplexing the re-constructed turbo streams and the normal stream.

17. The digital broadcasting transmission method of claim 14, wherein the multiplexing of the trellis encoded dual TS comprises multiplexing a first turbo stream, of the plurality of turbo streams, which is turbo processed, a second turbo stream, of the plurality of turbo streams, which is turbo processed and then pseudo 2 VSB-coded at the trellis encoding, a third turbo stream, of the plurality of turbo streams, which is turbo processed, and pseudo 2 VSB-coded and trellis encoded at the trellis encoding, and the normal stream, are multiplexed.

18. The digital broadcasting transmission method of claim 14, comprising inserting a supplementary reference signal to the encoded dual TS.

19. The digital broadcasting transmission method of claim 18, wherein the multiplexing multiplexes a first turbo stream, of the plurality of turbo streams, which is turbo processed, a second turbo stream, of the plurality of turbo streams, which is turbo processed and then pseudo 2 VSB-coded at the trellis encoding, a third turbo stream, of the plurality of turbo streams, which is turbo processed, pseudo 2 VSB-coded and trellis encoded at the trellis encoding, the turbo stream in which the supplementary reference signal is inserted, and the normal stream.

20. The digital broadcasting transmission method of claim 14, further comprising determining the location of a parity bit in the dual TS.

21. The digital broadcasting transmission method of claim 14, further comprising generating a compatible parity bit for compatibility with a receiver device, through an interaction with the trellis encoder.

22. A digital broadcasting reception system, comprising:
a demodulator to receive a dual transport stream (TS), including a normal stream and a turbo stream, transmitted from a digital broadcasting transmission, to detect a synchronization according to the synchronous signal added to a baseband signal of the TS, and to demodulate the TS;
an equalizer to equalize the demodulated dual TS by compensating for channel distortion due to multipaths of the channel;
a turbo decoder to decode the equalized turbo stream of the dual TS;
a viterbi decoder to correct errors of the normal stream of the dual TS, to decode error-corrected symbols thereof, and to output a symbol packet;
a receiver multiplexer (MUX) to multiplex the error-corrected normal stream and the decoded turbo stream;
a first deinterleaver to deinterleave the viterbi-decoded normal stream output from the receiver MUX;
a second deinterleaver to deinterleave the turbo stream output from the turbo decoder;
a parity eraser to remove a parity bit, which is appended to the deinterleaved turbo stream;
a derandomizer to derandomize the turbo stream from which the parity bit is removed; and
a de MUX to demultiplex the turbo stream.

23. The system according to claim 22, wherein the turbo decoder comprises:
a map decoder to trellis-decode the turbo stream, having an outer deinterleaver to deinterleave the trellis-decoded turbo stream, an outer map decoder to convolution-decode the deinterleaved turbo stream and to generate decoding data in accordance with the convolution-decoding result, and an outer interleaver to interleave the convolution-decoded turbo stream; and
a frame formatter to add the decoding data to a location of the TS corresponding to the location of the turbo stream.

24. The system according to claim 23, wherein, when information exchange is completed between the outer deinterleaver and the outer interleaver of the map decoder and the outer map decoder, the decoding data of the map decoder is outputted for use in the reception of the normal stream.

25. A digital broadcasting transmission apparatus, comprising:
an RS encoder to RS-encode an additional data stream;
an encoder to convolutional-encode the RS-encoded additional data stream;
a packet formatter to reconstruct the convolutional-encoded additional data stream; and
a TS multiplexer to multiplex the reconstructed additional data stream with a normal data stream.

26. The digital broadcasting transmission apparatus of claim 25, further comprising an input multiplexer to multiplex the additional data stream and provide the multiplexed additional data stream to the RS encoder.

27. The digital broadcasting transmission apparatus of claim 25, wherein the TS multiplexer multiplexes a packet of the additional data stream and a packet of the normal data stream according to a predetermined ratio.

28. A stream processing method of a digital broadcasting transmission apparatus, the method comprising:
RS-encoding an additional data stream;
convolutional-encoding the RS-encoded additional data stream;
reconstructing the convolutional-encoded additional data stream;
and multiplexing the reconstructed additional data stream with a normal data stream.

29. The stream processing method of claim 28, further comprising multiplexing the additional data stream and providing the multiplexed additional data stream to an RS encoder.

30. The stream processing method of claim 28, wherein the multiplexing multiplexes a packet of the additional data stream and a packet of the normal data stream according to a predetermined ratio.

31. A digital broadcasting reception apparatus, comprising:
a demodulator to demodulate a received transport stream; and
an equalizer to equalize the demodulated transport stream, wherein the received transport stream is transmitted from a digital broadcasting transmission apparatus, which comprises an RS encoder to RS-encode an additional data stream, an encoder to convolutional-encode the RS-encoded additional data stream, a packet formatter to reconstruct the convolutional-encoded additional data stream, and a TS multiplexer to multiplex the reconstructed additional data stream with a normal data stream to construct the transport stream.

32. The digital broadcasting reception apparatus of claim 31, wherein the digital broadcast transmission apparatus further comprises an input multiplexer to multiplex the additional data stream and provide the multiplexed additional data stream to the RS encoder.

33. The digital broadcasting reception apparatus of claim 31, wherein the TS multiplexer multiplexes a packet of the additional data stream and a packet of the normal data stream according to a predetermined ratio.

34. A stream processing method of a digital broadcasting reception apparatus, the method comprising:
demodulating a received transport stream; and
equalizing the demodulated transport stream,
wherein the received transport stream is transmitted from a digital broadcasting transmission apparatus, which comprises an RS encoder to RS-encode an additional data stream, an encoder to convolutional-encode the RS-encoded additional data stream, a packet formatter to reconstruct the convolutional-encoded additional data stream, and a TS multiplexer to multiplex the reconstructed additional data stream with a normal data stream to construct the transport stream.

35. The stream processing method of claim 34, wherein the digital broadcasting transmission apparatus further comprises an input multiplexer to multiplex the additional data stream and provide the multiplexed additional data stream to the RS encoder.

36. The stream processing method of claim 34, wherein the TS multiplexer multiplexes a packet of the additional data stream and a packet of the normal data stream according to a predetermined ratio.

* * * * *